United States Patent
Arana et al.

(10) Patent No.: US 8,674,519 B2
(45) Date of Patent: Mar. 18, 2014

(54) MICROELECTRONIC PACKAGE AND METHOD OF MANUFACTURING SAME

(75) Inventors: Leonel R. Arana, Phoenix, AZ (US); Edward R. Prack, Phoenix, AZ (US); Robert M. Nickerson, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 227 days.

(21) Appl. No.: 12/971,765

(22) Filed: Dec. 17, 2010

(65) Prior Publication Data

US 2012/0153504 A1 Jun. 21, 2012

(51) Int. Cl.
*H01L 23/48* (2006.01)

(52) U.S. Cl.
USPC .................................. 257/778; 257/E21.503

(58) Field of Classification Search
USPC .......... 438/106–112, 123–127; 257/777–784, 257/E21.503, E21.511
See application file for complete search history.

(56) References Cited

U.S. PATENT DOCUMENTS

| 6,018,463 | A * | 1/2000 | Winslow et al. .............. 361/803 |
| 6,429,534 | B1 | 8/2002 | Low et al. |
| 7,227,252 | B2 * | 6/2007 | Bolken et al. .................. 257/686 |
| 7,750,486 | B2 * | 7/2010 | Ohta ............................. 257/784 |
| 2004/0217459 | A1 | 11/2004 | Fee et al. |
| 2006/0055018 | A1 * | 3/2006 | Sekiguchi et al. ............ 257/686 |
| 2008/0128884 | A1 | 6/2008 | Meyer et al. |
| 2009/0243064 | A1 | 10/2009 | Camacho et al. |
| 2010/0165595 | A1 * | 7/2010 | Kim ............................... 361/809 |
| 2010/0237483 | A1 * | 9/2010 | Chi et al. ....................... 257/686 |

FOREIGN PATENT DOCUMENTS

WO 2012/082335 A1 6/2012

OTHER PUBLICATIONS

International Search Report and Written Opinion for PCT Patent Application No. PCT/US2011/061927, mailed on Jun. 1, 2012, 5 pages.
International Preliminary Report on Patentability received for PCT Patent Application No. PCT/US2011/061927, mailed on Jun. 18, 2013, 6 pages.

* cited by examiner

*Primary Examiner* — Brook Kebede
(74) *Attorney, Agent, or Firm* — Kenneth A. Nelson

(57) ABSTRACT

A microelectronic package includes a substrate (110, 210), an interposer (120, 220) having a first surface (121) and an opposing second surface (122), a microelectronic die (130, 230) attached to the substrate, and a mold compound (140) over the substrate. The interposer is electrically connected to the substrate using a wirebond (150). The first surface of the interposer is physically connected to the substrate with an adhesive (160), and the second surface has an electrically conductive contact (126) formed therein. The mold compound completely encapsulates the wirebond and partially encapsulates the interposer such that the electrically conductive contact in the second surface of the interposer remains uncovered by the mold compound.

15 Claims, 3 Drawing Sheets

MICROELECTRONIC PACKAGE AND METHOD OF MANUFACTURING SAME

FIELD OF THE INVENTION

The disclosed embodiments of the invention relate generally to microelectronic devices, and relate more particularly to packaging structures and related methods for microelectronic devices.

BACKGROUND OF THE INVENTION

Market pressures and expectations continue to drive the miniaturization of microelectronic devices and the products in which they are used. Accordingly, microprocessor manufacturers attempt to produce increasingly smaller and thinner microelectronic dies that can fit into increasingly smaller and shorter packages. The die attach process for thin dies, however, can be problematic due to die warpage and the corresponding difficulty with forming good connections between a warped die and a substrate. Existing techniques for manufacturing microelectronic components that do not exceed acceptable warpage targets present significant challenges and force difficult tradeoffs between meeting cost parameters and meeting customer requirements.

BRIEF DESCRIPTION OF THE DRAWINGS

The disclosed embodiments will be better understood from a reading of the following detailed description, taken in conjunction with the accompanying figures in the drawings in which.

Figure 1:
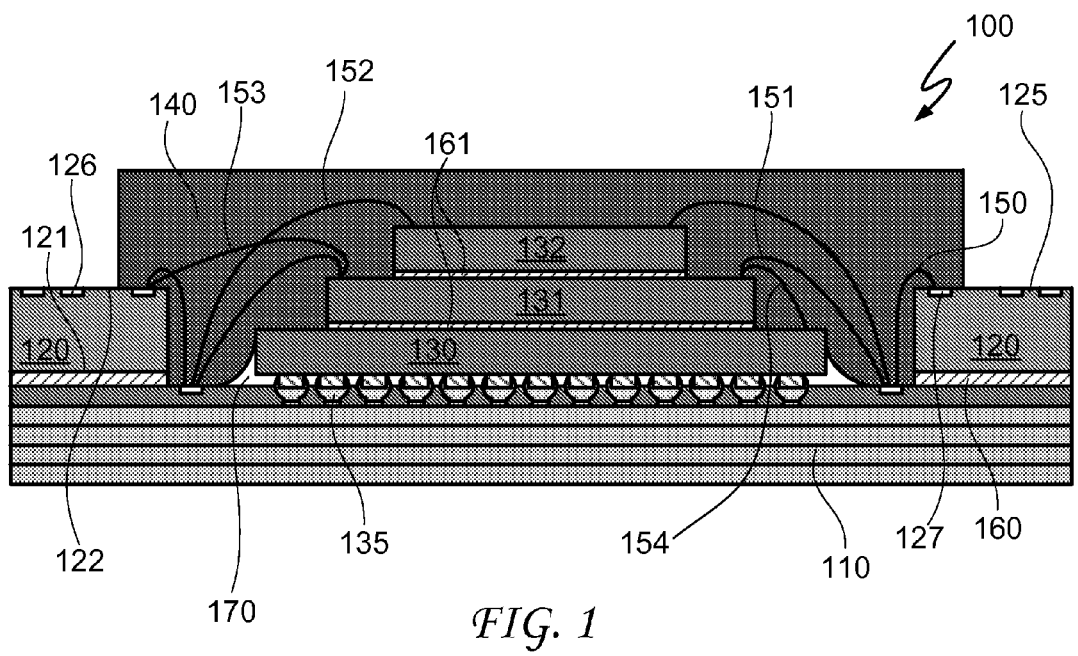
FIG. 1 is a cross-sectional view of a microelectronic package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a microelectronic package comprises a substrate, an interposer having a first surface and an opposing second surface, a microelectronic die attached to the substrate, and a mold compound over the substrate. The interposer is electrically connected to the substrate using a wirebond. The first surface of the interposer is physically connected to the substrate with an adhesive, and the second surface has an electrically conductive contact formed therein. The mold compound completely encapsulates the wirebond and partially encapsulates the interposer such that the electrically conductive contact in the second surface of the interposer remains uncovered by the mold compound.

Embodiments of the invention address package flatness/warpage issues and improve package mechanical integrity and, as will be described in detail below, offer a high degree of design flexibility in terms of top-side-contact pitch, package-on-package (POP) standoff, surface finish, die thickness, and other parameters. These embodiments may help overcome the relative high cost and reliability concerns for existing packaging approaches and offer a viable process to enable mixed-technology die stacking in a POP form factor.

An existing solution to enable thin POP stacking while allowing flexibility on die thickness and surface finish involves the use of a soldered interposer and flip-chip die attach. In other words, packages of the type being discussed have traditionally been pure flip-chip products. Embodiments of the present invention that use a wirebonded interposer go against the grain of existing solutions because, absent the inventive insights disclosed herein, there would seem to be no reason to introduce wirebonding into a product where flip-chip technology is already being used. Such reasons according to embodiments of the invention, however, will be described below.

The wirebonded interposer used in embodiments of the present invention would be less expensive than the soldered interposer approach used today because: (1) only one metal layer is needed on the interposer; (2) no plated through holes (PTHs) are needed, and thus any need for drilling is eliminated and one-sided processing is sufficient; and (3) no solders or bumping processes are required. Furthermore, by allowing relaxed flatness requirements for the interposer, embodiments of the invention increase ease of manufacturing, especially where film type adhesive with "green strength" is used for the interposer attach. (An adhesive with "green strength" is an adhesive that exhibits sufficient holding strength immediately upon application rather than only following a curing process.) Adhesive attach of interposer and substrate is more forgiving of incoming interposer warpage and tolerant of multi-piece interposers. In addition to the foregoing characteristics, embodiments of the invention may have better reliability than the soldered approach used today because: (1) solder joint reliability concerns (e.g., temperature cycle fatigue, shock risk) are eliminated; and (2) the risk of interposer separation during ball attach or surface mount is eliminated.

Another potential benefit of embodiments of the invention is that the interconnect pitch (i.e., the wirebond pitch) can be significantly smaller, and the number of interconnects (i.e., the number of wirebonds) significantly larger, than is possible with the soldered interposer approach, which means that the wirebond approach of embodiments of the invention is much more scalable. (The interconnect pitch is defined as the spacing between two adjacent interconnects.) Furthermore, a wirebonded interposer does not rely on the limitations of the surface mount process, as soldered interposers do. With surface mount, there are limitations on how much the pitch can be scaled. A pitch of 0.4 millimeters (mm) may be achievable but a 0.3 mm pitch, for example, for which a lower solder volume is used during surface mount, would require that a much flatter interposer be used as a starting point, and the interposer would be more sensitive to warpage because there would be less solder present and less solder collapse during surface mount to compensate for the interposer warpage. For even smaller pitches, (e.g., 0.2 mm and smaller) the scaling problems become even more pronounced, to the point where viable processes, or at least high-volume manufacturing processes, may not even currently exist. In short, there exist scaling risks with the surface mount approach. Those risks are eliminated by the wirebonded interposer of the present invention. The wires making up the wirebonds can be very tightly spaced such that one could very easily achieve pitches as small as 0.1 mm or smaller.

Referring now to the drawings, FIG. 1 is a cross-sectional view of a microelectronic package 100 according to an embodiment of the invention. As detailed below, microelectronic package 100 includes an interposer, with exposed top side contacts (or "lands"), that is attached to a substrate using an adhesive and that is electrically connected to the substrate using wirebonds. As an example, an upper surface of the interposer may have exposed top side lands, wirebond pads (which may or may not be exposed (i.e., uncovered by mold compound)), and conductive traces that route (electrically connect) the exposed lands and the wirebond pads to each other.

As illustrated in FIG. 1, microelectronic package 100 comprises a substrate 110 (with multiple conductive and dielectric layers indicated by horizontal lines), an interposer 120 having a surface 121 and an opposing surface 122, a microelectronic die 130 attached to substrate 110, and a mold compound 140 over substrate 110. As shown, interposer 120 is electrically connected to substrate 110 using a wirebond 150, surface 121 of interposer 120 is physically connected to substrate 110 with an adhesive 160, and surface 122 of interposer 120 has an electrically conductive contact 126 formed therein. Mold compound 140 completely encapsulates wirebond 150 and partially encapsulates interposer 120 such that electrically conductive contact 126 remains uncovered by mold compound 140. Additional electrically conductive contacts 127, which may or may not be encapsulated by mold compound 140, may also be present in certain embodiments of the invention.

In the illustrated embodiment, die 130 is attached to substrate 110 using flip-chip interconnects 135. Also illustrated are microelectronic dies 131 and 132, each with an adhesive layer 161, stacked above microelectronic die 130, and an underfill material 170 surrounding flip-chip interconnects 135. The illustrated embodiment may thus be characterized as a mixed-technology (i.e., flip-chip+wirebond) stacked die architecture. Other (non-illustrated) embodiments of the invention may include single-chip (discrete) architectures and single-technology (i.e., either flip-chip or wirebond) architectures, in any combination.

Wirebonds 151 and 152 electrically connect microelectronic dies 131 and 132, respectively, to substrate 110. A wirebond 153 electrically connects microelectronic die 131 to interposer 120. Additional stacked dies, if any, may be connected to the interposer and/or to the substrate in the same way. Furthermore, one or more of the stacked dies may be electrically connected to one or more of the other stacked dies using additional wirebonds. This is illustrated in FIG. 1 with a wirebond 154.

Mold compound 140 completely encapsulates microelectronic die 130 (and microelectronic dies 131 and 132), but in other embodiments one or more of the microelectronic dies may be only partially encapsulated. For example, one embodiment may feature a "bare die," i.e., a die having a backside (or other) surface that is not covered by mold compound but that instead is exposed, perhaps in order that a heat dissipation device or a similar device may be placed thereon. Such a bare die may be the only die in a particular microelectronic package, or it may be one of multiple dies. One such bare die embodiment involves a thicker die where the die extends to the top of the mold compound and has its backside exposed. Alternatively, the interposer and the wires could be scaled down in order to achieve a thinner package after molding while keeping the same die thickness for ease of assembly purposes.

Returning to the illustrated embodiment, the mold compound that fully encapsulates the microelectronic die (or dies) helps to manage package flatness and to control warpage. In fact, such overmolding may be the only practical way to achieve required flatness specifications, and because overmolding a package having a soldered interposer (as existing package architectures have), while keeping the interposer top-side contacts exposed, is difficult or impossible to do under high-volume manufacturing conditions, the wirebonded interposer of the present invention is likely to be of significant value in microelectronic package manufacturing, especially where package flatness is an important consideration.

Interposer 120, in the embodiment shown in FIG. 1, contains only one metal layer—metal layer 125—and this single metal layer is located at surface 122. As shown, electrically conductive contact 126 is formed in metal layer 125. Soldered interposers such as are used in existing microelectronic packages have multiple metal layers and thus require plated through holes (PTHs) for communication between one metal layer and another. However, PTHs are expensive because of the various drilling and plating steps necessary to make them. In contrast, a wirebonded interposer like interposer 120 needs no drilling and, with its single metal layer, requires only a single plating step and a single metal patterning step. The absence of additional metal layers (i.e., beyond the single metal layer 125 discussed above), and of corresponding PTHs, means that interposer 120 is less expensive and easier to manufacture than such a multiple-metal-layer interposer would be.

Figures 2A, 2B:
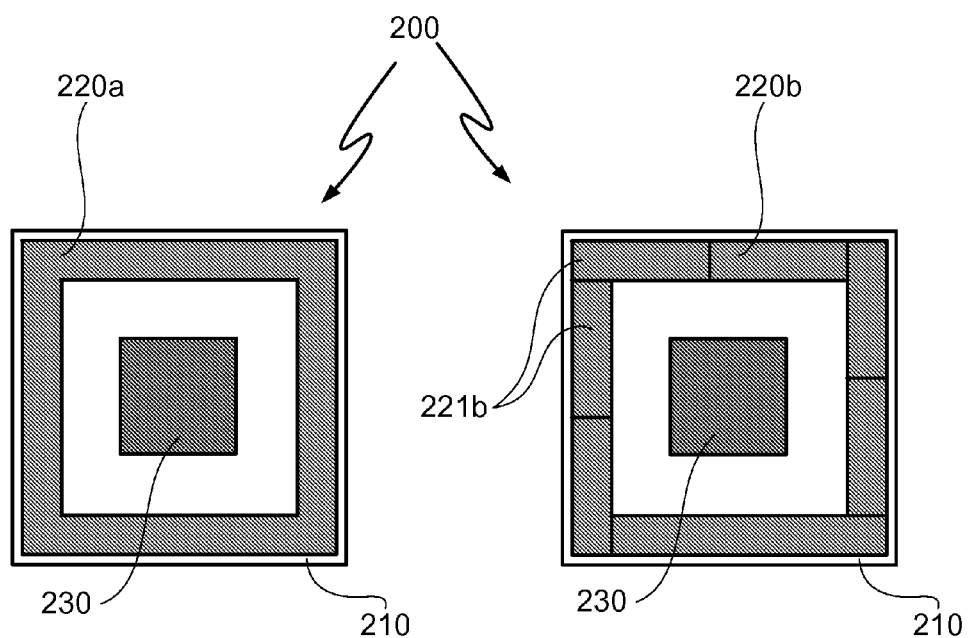
FIGS. 2a and 2b are plan views of an interposer and other portions of a microelectronic package according to embodiments of the invention.

FIGS. 2a and 2b are plan views of an interposer and other portions of a microelectronic package 200 according to embodiments of the invention. As illustrated, package 200 comprises a substrate 210, an interposer 220 on substrate 210, and a die 230 resting on or otherwise attached to substrate 210. As shown, die 230 is surrounded by interposer 220. In FIG. 2a, interposer 220a is a single continuous piece— shaped like a picture frame—located on substrate 210. As an example, interposer 220a can be transferred to its location on substrate 210 using a pick-and-place procedure.

Single-piece interposers like interposer 220a are rather inefficient in terms of materials usage because they are typically manufactured in large panels with the middle section of each interposer being removed and discarded. The manufacturing process could be made much more efficient, and many more interposers could be manufactured per panel if, for example, the panels were used to produce rectangular interposer sections like sections 221b, multiple ones of which could then be arranged—see interposer 220b—on substrate 210 into the same picture frame shape exhibited by interposer 220a. Such individual pieces could all be the same length or they could be of various different lengths. As before, interposers 220 may be held in place on substrate 210 using an adhesive such as adhesive 160 (see FIG. 1). An adhesive with sufficient green strength (defined above) will likely minimize or eliminate any warping or alignment issues where the interposer is concerned.

Figure 3:
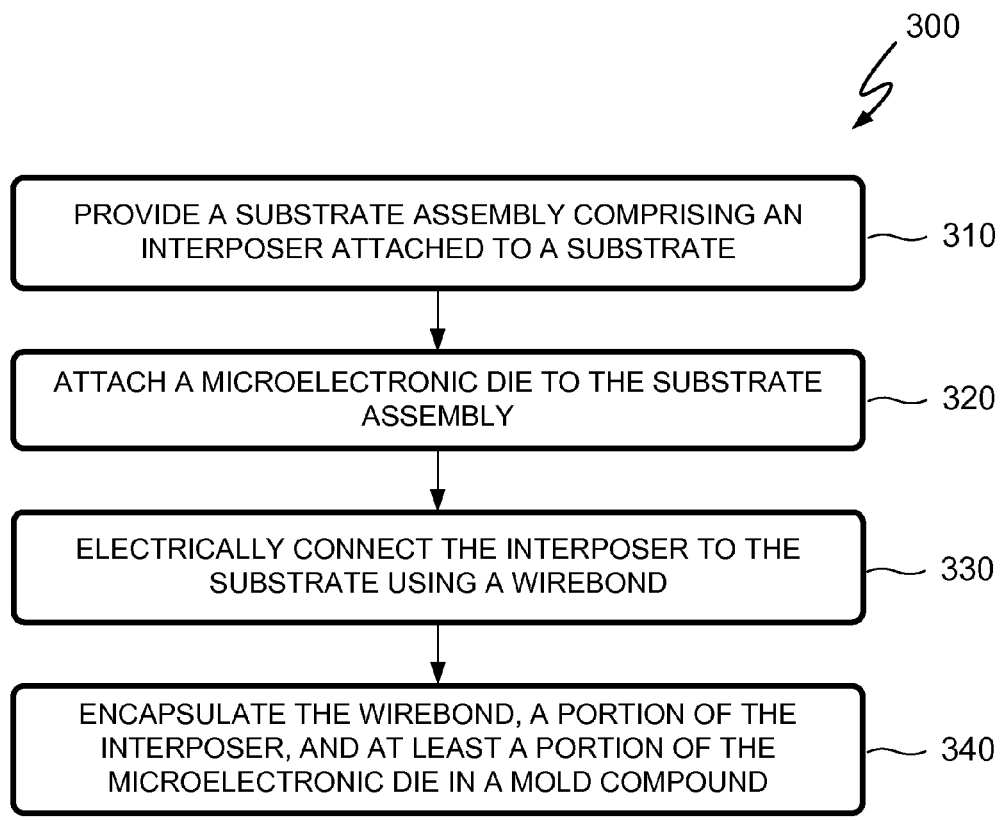
FIGS. 3 and 4 are flowcharts illustrating methods of manufacturing a microelectronic package according to embodiments of the invention.

FIG. 3 is a flowchart illustrating a method 300 of manufacturing a microelectronic package according to an embodiment of the invention. As an example, method 300 may result in the formation of a microelectronic package that is similar to microelectronic package 100 that is shown in FIG. 1.

A step 310 of method 300 is to provide a substrate assembly comprising an interposer attached to a substrate. As an example, the interposer can be similar to interposer 120 and the substrate can be similar to substrate 110, both of which are shown in FIG. 1. A standard die attach adhesive, either in paste form or film form, may be used. The adhesive is optionally cured prior to the subsequent step.

A step 320 of method 300 is to attach a microelectronic die to the substrate assembly. As an example, the microelectronic die can be similar to microelectronic die 130 that is shown in FIG. 1. In one embodiment, step 320 comprises performing a flip-chip assembly process flow, which can include forming flip-chip interconnects (such as flip-chip interconnects 135) at a surface of the microelectronic die. In the same or another embodiment, step 320 comprises causing an underfill material to be formed around at least some of the flip-chip interconnects. As an example, the underfill material can be similar to underfill material 170 that is shown in FIG. 1.

In embodiments where a second microelectronic die is used, step 320, or another step, further comprises physically attaching the second die to the die mentioned above, i.e., what was referred to simply as the microelectronic die, and electrically connecting the second die to at least one of the interposer and the substrate. In one embodiment, one or more wirebonds are used to electrically connect the interposer and/or the substrate and the second die to each other.

A step 330 of method 300 is to electrically connect the interposer to the substrate using a wirebond. As an example, the wirebond can be similar to wirebond 150 that is shown in FIG. 1.

A step 340 of method 300 is to encapsulate the wirebond, a portion of the interposer, and at least a portion of the microelectronic die in a mold compound. As an example, the mold compound can be similar to mold compound 140 that is shown in FIG. 1. In certain embodiments, the microelectronic die is fully encapsulated by the mold compound. A variety of molding processes may be used, including transfer molding, compression molding, and the like. As an example, a mold chase design that partially clamps down on the top surface of the interposer (optionally with a release film) may be used so as to leave the top pads exposed. A post mold cure in an oven may be carried out, if needed. Optionally, a deflash process may be used to clean mold flash off the pads.

Figure 4:
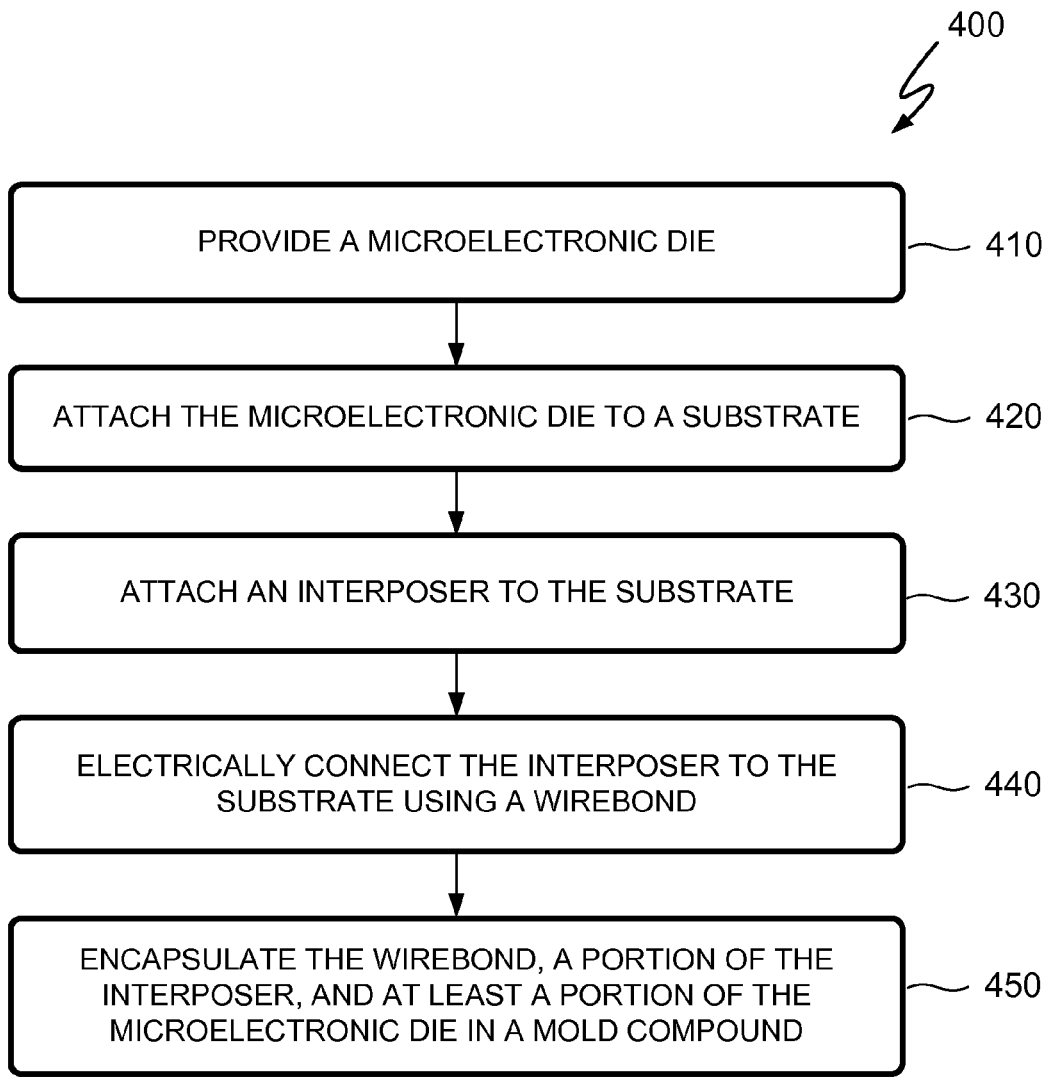

FIG. 4 is a flowchart illustrating a method of manufacturing a microelectronic package according to a different embodiment of the invention. As an example, method 400, like method 300, may result in the formation of a microelectronic package that is similar to microelectronic package 100 that is shown in FIG. 1. Methods 300 and 400 differ from each other, in part, in terms of the timing of the die attach process (e.g., either before or after the interposer attach).

A step 410 of method 400 is to provide a microelectronic die. As an example, the microelectronic die can be similar to microelectronic die 130 that is shown in FIG. 1.

A step 420 of method 400 is to attach the microelectronic die to a substrate. As an example, the substrate can be similar to substrate 110 that is shown in FIG. 1. In one embodiment, step 420 comprises causing an underfill material to be formed around a portion of the microelectronic die. As an example, the underfill material can be similar to underfill material 170 that is shown in FIG. 1.

In embodiments where a second microelectronic die is used, step 420, or another step, further comprises physically attaching the second die to the die mentioned above, i.e., what was referred to simply as the microelectronic die, and electrically connecting the second die to at least one of the interposer and the substrate. In one embodiment, one or more wirebonds are used to electrically connect the interposer and/or the substrate and the second die to each other.

A step 430 of method 400 is to attach an interposer to the substrate. As an example, the interposer can be similar to interposer 120 that is shown in FIG. 1. In one embodiment, step 430 comprises using an adhesive, perhaps in the form of paste or film, and step 430 or another step optionally comprises curing the adhesive prior to electrically connecting the interposer to the substrate.

A step 440 of method 400 is to electrically connect the interposer to the substrate using a wirebond. As an example, the wirebond can be similar to wirebond 150 that is shown in FIG. 1.

A step 450 of method 400 is to encapsulate the wirebond, a portion of the interposer, and at least a portion of the microelectronic die in a mold compound. As an example, the mold compound can be similar to mold compound 140 that is shown in FIG. 1. In certain embodiments, the microelectronic die is fully encapsulated by the mold compound. A variety of molding processes may be used, including transfer molding, compression molding, and the like. As an example, a mold chase design that partially clamps down on the top surface of the interposer (optionally with a release film) may be used so as to leave the top pads exposed. A post mold cure in an oven may be carried out, if needed. Optionally, a deflash process may be used to clean mold flash off the pads.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the microelectronic package and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A microelectronic package comprising:
   a substrate;
   an interposer having a first surface and an opposing second surface, wherein the interposer comprises only one metal layer, the metal layer being located at the second surface of the interposer, and the interposer is electrically connected to the substrate using a wirebond, the first surface is physically connected to the substrate with an adhesive, and the second surface has an electrically conductive contact formed therein such that the electrically conductive contact is formed in the metal layer;
   a microelectronic die attached to the substrate; and
   a mold compound over the substrate, the mold compound completely encapsulating the wirebond and partially encapsulating the interposer such that the electrically conductive contact in the second surface of the interposer remains uncovered by the mold compound.

2. The microelectronic package of claim 1 wherein:
   the mold compound completely encapsulates the microelectronic die.

3. The microelectronic package of claim 1 wherein:
   the microelectronic die is attached to the substrate using flip-chip interconnects.

4. The microelectronic package of claim 3 further comprising:
   a second microelectronic die stacked above the microelectronic die.

5. The microelectronic package of claim 4 wherein:
   the second microelectronic die is electrically connected to the substrate using a second wirebond.

6. The microelectronic package of claim 1 wherein:
   the interposer is a single continuous piece that forms a frame around the die.

7. The microelectronic package of claim 1 wherein:
   the interposer is composed of multiple pieces arranged on the substrate so as form a frame around the die.

8. A method of manufacturing a microelectronic package, the method comprising:
   providing a microelectronic die;
   attaching the microelectronic die to a substrate;
   attaching an interposer to the substrate, the interposer having an electrically conductive contact formed therein;
   electrically connecting the interposer to the substrate using a wirebond; and
   encapsulating the wirebond, a portion of the interposer, and at least a portion of the microelectronic die in a mold compound but leaving the electrically conductive contact uncovered by the mold compound,
   wherein:
      attaching the interposer to the substrate comprises using an adhesive; and
      the method further comprises curing the adhesive prior to electrically connecting the interposer to the substrate.

9. The method of claim 8 wherein:
   attaching the microelectronic die comprises causing an underfill material to be formed around a portion of the microelectronic die.

10. The method of claim 8 further comprising:
    physically attaching a second microelectronic die to the microelectronic die; and
    electrically connecting the second microelectronic die to at least one of the interposer and the substrate.

11. The method of claim 10 wherein:
    electrically connecting the second microelectronic die to at least one of the interposer and the substrate comprises connecting the second microelectronic die and at least one of the interposer and the substrate to each other using a wirebond.

12. The method of claim 8 wherein:
    encapsulating at least a portion of the microelectronic die comprises fully encapsulating the microelectronic die in the mold compound.

13. A microelectronic package comprising:
    a substrate;
    an interposer having a first surface and an opposing second surface, wherein the interposer is a single continuous piece that forms a frame around the die and is electrically connected to the substrate using a wirebond, wherein the first surface is physically connected to the substrate with an adhesive, and wherein the second surface has an electrically conductive contact formed therein;
    a microelectronic die attached to the substrate; and
    a mold compound over the substrate, the mold compound completely encapsulating the wirebond and partially encapsulating the interposer such that the electrically conductive contact in the second surface of the interposer remains uncovered by the mold compound.

14. The microelectronic package of claim 13 further comprising:
    a second microelectronic die stacked above the microelectronic die.

15. The microelectronic package of claim 14 wherein:
    the second microelectronic die is electrically connected to the substrate using a second wirebond.

* * * * *